(12) United States Patent
Yan

(10) Patent No.: US 6,998,202 B2
(45) Date of Patent: *Feb. 14, 2006

(54) MULTILAYER REFLECTIVE EXTREME ULTRAVIOLET LITHOGRAPHY MASK BLANKS

(75) Inventor: Pei-Yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 214 days.

This patent is subject to a terminal disclaimer.

(21) Appl. No.: 10/631,171

(22) Filed: Jul. 31, 2003

(65) Prior Publication Data

US 2005/0026046 A1    Feb. 3, 2005

(51) Int. Cl.
    *G01F 9/00*    (2006.01)
(52) U.S. Cl. .......................................... 430/5
(58) Field of Classification Search .................. 430/5, 430/322, 324; 428/428, 432; 378/35, 34
    See application file for complete search history.

(56) References Cited

U.S. PATENT DOCUMENTS

| 6,607,862 B2 * | 8/2003 | Yan et al. ................. 430/5 |
| 6,724,462 B1 * | 4/2004 | Singh et al. ............... 355/53 |
| 2003/0008180 A1 | 1/2003 | Bajt et al. |
| 2003/0031937 A1 | 2/2003 | Yan |
| 2003/0123605 A1 | 7/2003 | Rau |
| 2004/0002009 A1 | 1/2004 | Yan |

FOREIGN PATENT DOCUMENTS

| EP | 1 065 568 | 1/2001 |
| EP | 1 394 815 | 3/2004 |
| JP | 2003-249434 | 9/2003 |

OTHER PUBLICATIONS

M. Singh et al., *Capping Layers For Extreme-Ultraviolet Multilayer Interference Coatings*; Optics Letters, Optical Society of America, Washington, vol. 26, No. 5, Mar. 1, 2001, pp. 259-261.

* cited by examiner

*Primary Examiner*—S. Rosasco
(74) *Attorney, Agent, or Firm*—Trop, Pruner & Hu, P.C.

(57) ABSTRACT

An extreme ultraviolet lithography mask may be formed of a multilayered stack covered by a spacer layer, such as silicon or boron carbide, in turn covered by a thin layer to prevent inter-diffusion, and finally covered by a capping layer of ruthenium. By optimizing the spacer layer thickness based on the capping layer, the optical properties may be improved.

28 Claims, 1 Drawing Sheet

MULTILAYER REFLECTIVE EXTREME ULTRAVIOLET LITHOGRAPHY MASK BLANKS

BACKGROUND

This invention relates generally to extreme ultraviolet lithography mask blanks.

In extreme ultraviolet lithography, a mask is formed from a blank. The blank provides a reflective surface which defines features. Extreme ultraviolet radiation is shined on the blank and is reflected therefrom to transfer features from the blank to a semiconductor wafer in a repeatable fashion.

Generally, extreme ultraviolet lithography masks are reflective masks fabricated by depositing interference multilayers such as molybdenum and silicon in alternating layers. The very top ending layer is referred to as a capping layer. Typically a silicon layer is used as a capping layer.

The thicker silicon capping layer is needed because of the mask patterning process control requirements. In the mask patterning process, the silicon capping layer serves as the etch stop layer for the buffer layer etch. During the buffer layer etch, when the etch selectivity to the multilayer capping layer is low, the capping layer is partially and non-uniformly removed. For example, one promising buffer layer for extreme ultraviolet lithography mask patterning is silicon dioxide. However, the etch selectivity to the silicon capping layer in a square mask etcher is rather low, for example, about 3 to 1.

Thus, there is a need for better ways to make blanks for extreme ultraviolet lithography.

DETAILED DESCRIPTION

Figure 1:
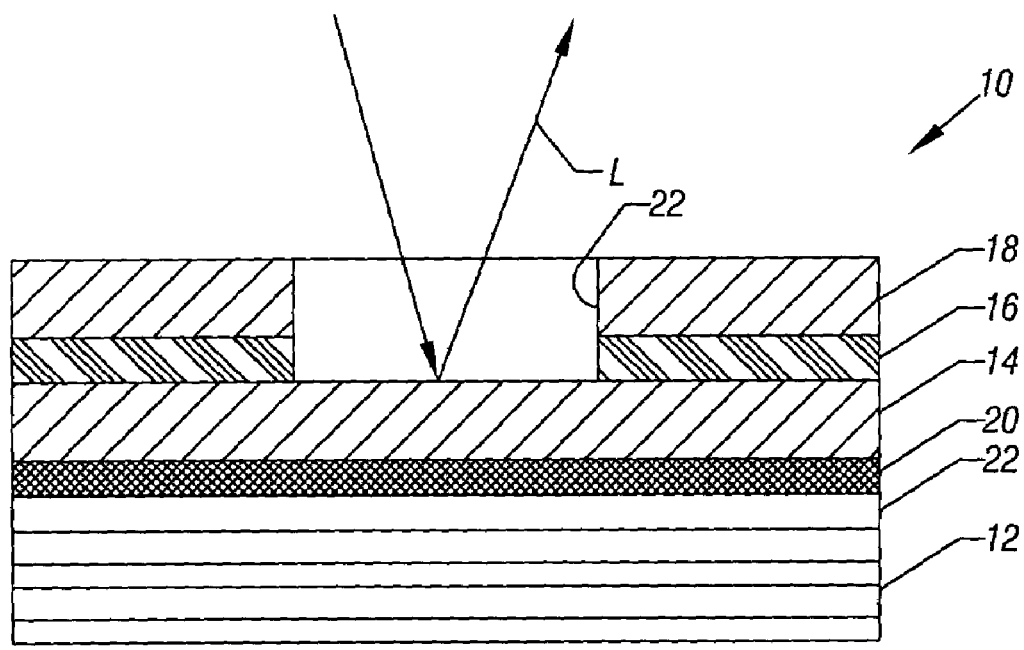
FIG. 1 is a partial, enlarged cross-sectional view of one embodiment of the present invention.

An upper masking layer 18 and a lower masking layer 16 have an aperture 22. Radiation, indicated by the lines L, is reflected from the bottom of the aperture 22. The radiation may be extreme ultraviolet irradiation in one embodiment of the present invention. A pattern of a large number of apertures 22 may be transferred to a semiconductor wafer (not shown) by reflecting radiation from those apertures 22.

The radiation is actually reflected from the capping layer 14 that, in one embodiment of the present invention, may be formed of ruthenium. In one embodiment, the layer 14 may be of a thickness of from about 1 to 4.5 nanometers and, particularly, greater than 2 nanometers.

A ruthenium capping layer 14 is resistant to the oxidation. In addition, the etch selectivity of the buffer silicon dioxide layer to ruthenium is much larger than that of a silicon capping layer. The ruthenium layer also has better chemical cleaning resistance than a silicon capping layer.

While ruthenium has a higher extreme ultraviolet absorption coefficient than silicon, a sufficiently thin ruthenium capping layer may be utilized without dramatically reducing the multilayer reflectivity.

A ruthenium capping layer 14 of 2 nanometers may be susceptible to damage during mask patterning processes. However, a thicker ruthenium capping layer may reduce the multilayer reflectivity, and may produce a larger multilayer reflectivity variation, if the ruthenium capping layer happens to be non-uniform.

The ruthenium capping layer 14 may be deposited over an interface layer 20. The interface layer 20 may be molybdenum or boron carbide, to mention two examples. The layer 20 may reduce or prevent inter-diffusion between the layers 14 and 22. In one embodiment, the layer 20 may be 5 Angstroms in thickness.

A spacer layer 22, below the layer 20, may have a thickness between about 2.4 and about 3.8 nanometers in one embodiment of the present invention. In this range, the multilayer reflectivity variation, as a result of any ruthenium capping layer 14 thickness variation, may be controlled. Advantageously, the spacer layer 22 has lower extreme ultraviolet absorption. The spacer layer 22 may be silicon, in one embodiment.

Below the layer 22 is the multilayer stack 12. In one embodiment, the multilayer stack includes a first layer of silicon of approximately 4.2 nanometers covered by a layer of molybdenum of 2.8 nanometers. This may be followed by another layer of silicon and thereafter another layer of molybdenum in one embodiment of the present invention.

In some embodiments, optimizing the spacer layer 22 may enable the use of a thicker capping layer 14 that may be used to protect the multilayer stack 12 from damage from the patterning process steps. The optimized spacer layer 22 not only can optimize the peak multilayer reflectivity, but can also reduce or even minimize, for a given capping layer material and thickness, the multilayer reflectivity variation when the capping layer 14 is partially and non-uniformly removed. This may result in larger mask patterning process margins in some embodiments.

For example, simulation indicates that with a standard multilayer stack (the spacer layer 22 having a standard silicon layer of 4.14 nanometers as used in the Mo/Si multilayer stack)and a very thin interface layer 20 (<5A), the optimized capping layer 14 thickness is around 2 nanometers. This thickness provides maximum multilayer blank peak reflectivity of about 75 percent and minimum reflectivity variation of 0.5 percent when layer 14 thickness varies from 2–0.4 nanometers. However, this relatively thin capping layer 14 thickness gives rise to the problems with capping layers described above. To increase the capping layer 14 thickness beyond 2 nanometers without optimizing the spacer layer 22, the blank peak reflectivity will be reduced drastically as layer 14 thickness increases. The average reflectivity reduction per nanometer of capping layer 14 thickness increase for capping layer 14 thicknesses in the range of 2–4 nanometer is about 3.5 percent. As a result, larger reflectivity variation will result when the capping layer 14 thickness variation exists.

However, with a 3.8 nanometer silicon spacer layer 22, the optimized capping layer 14 thickness can go up to 2.3 nanometers with only a slight increase in the multilayer blank peak reflectivity. The multilayer reflectivity variation is still within 0.5 percent when the capping layer 14 thickness variation is between 2.3–0.7 nanometers. Similarly, with a 2.9 nanometer silicon spacer 22, the optimized capping layer 14 thickness can go up to 3.3 nanometers with slight treadoff for the peak reflectivity (about 1.0 percent reflectivity loss). For maintaining the multilayer reflectivity variation within 0.5 percent, the capping layer 14 thickness variation can be between 3.3–1.7 nanometers. Finally, with a 2.4 nanometer silicon spacer 22, the optimized capping layer 14 thickness can go up to 3.8 nanometers, again with a small tradeoff for the peak reflectivity (about 2.5 percent reflectivity loss). The capping layer 14 thickness can vary from 3.8–2.4 nanometers with a reflectivity variation of less than 0.5 percent. Thus, it is clear that the optimization of the spacer layer 22 enables the use of a significantly thicker capping layer 14.

In the actual multilayer fabrication, due to interlayer diffusion effect, the calculated optimized spacer thickness may deviate from that of experimentally obtained value. However, the optimization theory/principle remains the same.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming an extreme ultraviolet lithography blank having a multilayer stack;
   forming a non-ruthenium spacer layer over said multilayer stack; and
   forming a ruthenium capping layer over said spacer layer.

2. The method of claim 1 wherein forming a non-ruthenium spacer layer over said multilayer stack includes forming a silicon spacer layer.

3. The method of claim 1 including providing a spacer layer having a thickness of at least about 2.4 nanometers.

4. The method of claim 1 including forming an interface layer between said non-ruthenium spacer layer and said ruthenium capping layer to prevent diffusion between said non-ruthenium spacer layer and said ruthenium capping layer.

5. The method of claim 4 including forming said interface layer at a thickness of about 5 Angstroms.

6. The method of claim 5 including forming said interface layer of molybdenum or boron carbide.

7. The method of claim 1 including forming said spacer layer between about 1 and about 4.5 nanometers in thickness.

8. The method of claim 1 including forming the ruthenium capping layer of a thickness greater than 2 nanometers.

9. The method of claim 1 including forming said capping layer of a thickness greater than 3 nanometers.

10. The method of claim 1 including forming said capping layer of approximately 3.8 nanometers.

11. An extreme ultraviolet lithography mask comprising:
    a multilayer stack;
    a non-ruthenium spacer layer over said multilayer stack; and
    a ruthenium capping layer over said spacer layer.

12. The mask of claim 11 wherein said spacer layer is formed of silicon.

13. The mask of claim 11 wherein said spacer layer has a thickness of at least about 2.4 nanometers.

14. The mask of claim 11 including an interface layer between said non-ruthenium spacer layer and said ruthenium capping layer to prevent diffusion between said non-ruthenium spacer layer and said ruthenium capping layer.

15. The mask of claim 14 wherein said interface layer has a thickness of about 5 Angstroms.

16. The mask of claim 15 wherein said interface layer is formed of molybdenum or boron carbide.

17. The mask of claim 11 wherein said spacer layer is between about 2.4 and about 3.8 nanometers in thickness.

18. The mask of claim 11 wherein said ruthenium capping layer has a thickness greater than 2 nanometers.

19. The mask of claim 11 wherein said capping layer has a thickness greater than 3 nanometers.

20. The mask of claim 11 wherein said capping layer has a thickness of approximately 3.8 nanometers.

21. An extreme ultraviolet lithograph mask comprising:
    a multilayer stack;
    a silicon spacer layer over said multilayer stack; and
    a ruthenium capping layer over said spacer layer, said capping layer having a thickness greater than 2 nanometers.

22. The mask of claim 21 wherein said spacer layer has a thickness of at least about 2.4 nanometers.

23. The mask of claim 21 including an interface layer between said spacer layer and said ruthenium capping layer to prevent diffusion between said spacer layer and said ruthenium capping layer.

24. The mask of claim 23 wherein said interface layer has a thickness of about 5 Angstroms.

25. The mask of claim 24 wherein said interface layer is formed of molybdenum or boron carbide.

26. The mask of claim 21 wherein said spacer layer is between about 2.4 and about 3.8 nanometers in thickness.

27. The mask of claim 21 wherein said capping layer has a thickness greater than 3 nanometers.

28. The mask of claim 21 wherein said capping layer has a thickness of approximately 3.8 nanometers.

* * * * *